US011335531B2

(12) United States Patent
Olson et al.

(10) Patent No.: US 11,335,531 B2
(45) Date of Patent: May 17, 2022

(54) SHADOW MASK APPARATUS AND METHODS FOR VARIABLE ETCH DEPTHS

(71) Applicant: Applied Materials, Inc., Santa Clara, CA (US)

(72) Inventors: Joseph C. Olson, Beverly, MA (US); Morgan Evans, Manchester, MA (US); Thomas Soldi, West Simsbury, CT (US); Rutger Meyer Timmerman Thijssen, Sunnyvale, CA (US); Maurice Emerson Peploski, Potsdam, NY (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/789,591

(22) Filed: Feb. 13, 2020

(65) Prior Publication Data
US 2021/0257179 A1 Aug. 19, 2021

(51) Int. Cl.
*H01J 37/08* (2006.01)
*H01J 29/07* (2006.01)
*H01J 37/20* (2006.01)
*H01J 37/305* (2006.01)

(52) U.S. Cl.
CPC .............. *H01J 37/08* (2013.01); *H01J 29/07* (2013.01); *H01J 37/20* (2013.01); *H01J 37/3056* (2013.01)

(58) Field of Classification Search
CPC ..................... H01J 37/3056; H01J 37/08
See application file for complete search history.

(56) References Cited

U.S. PATENT DOCUMENTS

| 6,043,595 | A  | * | 3/2000 | Yokoyama | ............... | H01J 29/07 |
| | | | | | | 313/402 |
| 2013/0192521 | A1 | | 8/2013 | Chu et al. | | |
| 2016/0204451 | A1 | | 7/2016 | Kwak et al. | | |
| 2016/0246010 | A1 | * | 8/2016 | Medhat | ................... | C23C 16/04 |
| 2019/0258008 | A1 | * | 8/2019 | Hautala | .................... | G02B 6/34 |

FOREIGN PATENT DOCUMENTS

| WO | 2019090328 A1 | 5/2019 |
| WO | WO-2019090328 A1 * | 5/2019 ........... G02B 5/1814 |
| WO | 2019108379 A1 | 6/2019 |

OTHER PUBLICATIONS

International Search Report dated Apr. 26, 2021, for the International Patent Application No. PCT/US2020/067305, filed on Dec. 29, 2020, 3 pages.
Written Opinion dated Apr. 26, 2021, for the International Patent Application No. PCT/US2020/067305, filed on Dec. 29, 2020, 6 pages.

* cited by examiner

Primary Examiner — Binh X Tran
(74) Attorney, Agent, or Firm — KDB

(57) ABSTRACT

Methods of producing grating materials with variable height are provided. In one example, a method may include providing a grating material atop a substrate, and positioning a shadow mask between the grating material and an ion source, wherein the shadow mask is separated from the grating material by a distance. The method may further include etching the grating material using an ion beam passing through a set of openings of the shadow mask, wherein a first depth of a first portion of the grating material is different than a second depth of a second portion of the grating material.

12 Claims, 10 Drawing Sheets

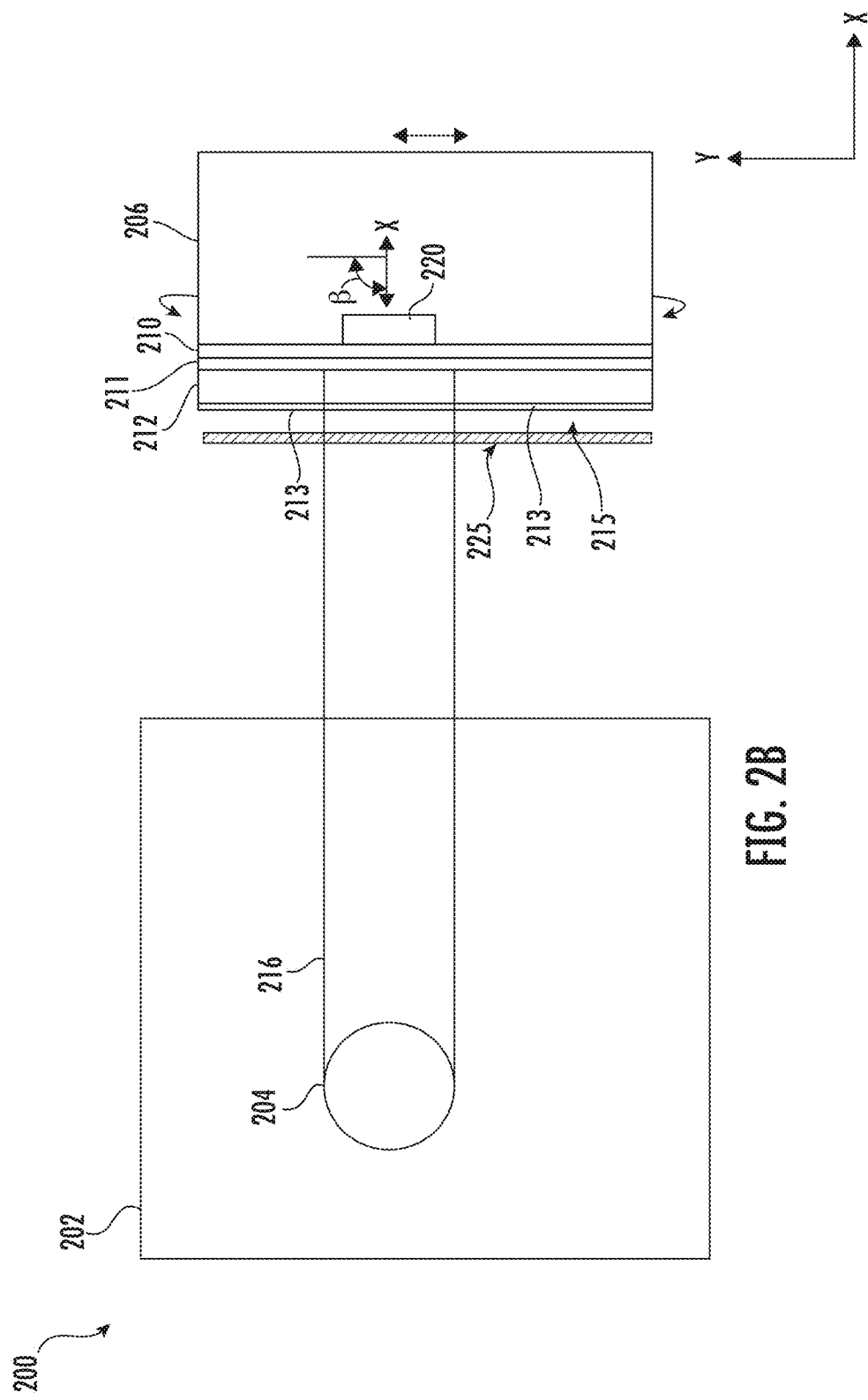

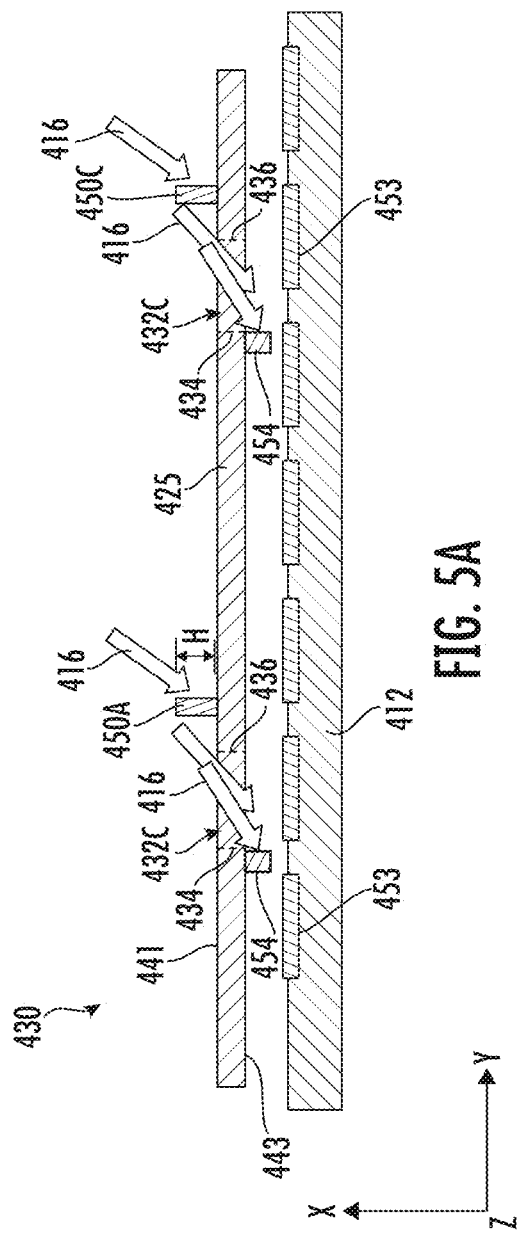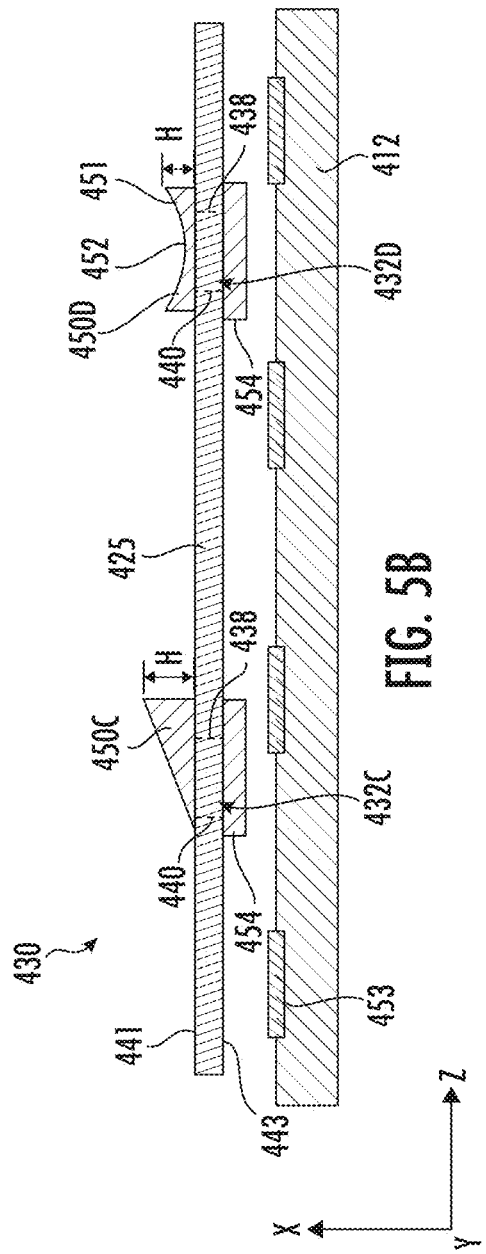

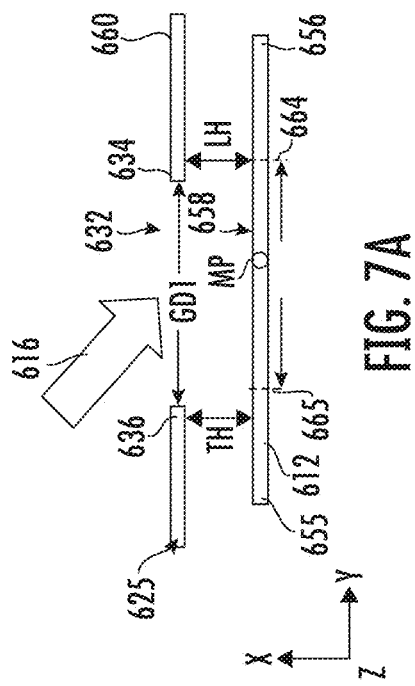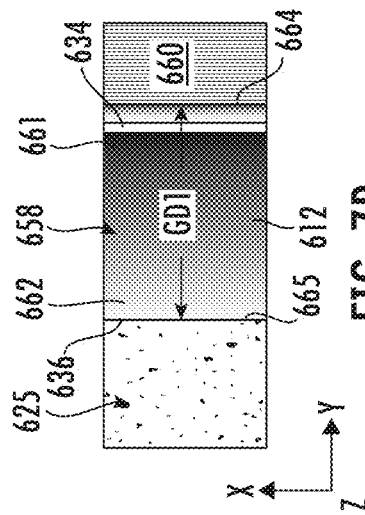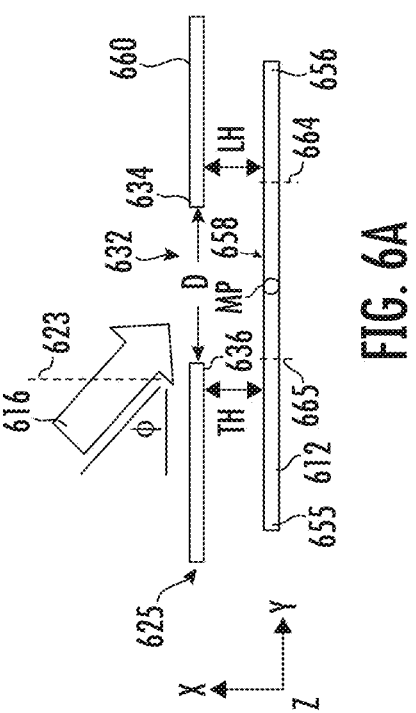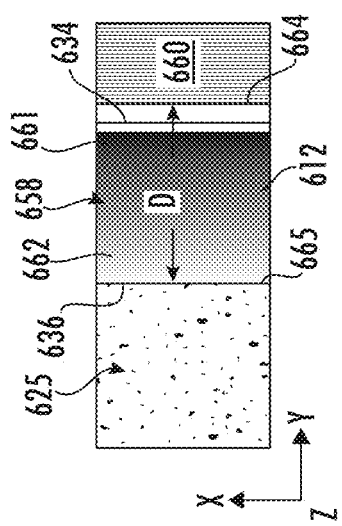
FIG. 6A
FIG. 6B
FIG. 7A
FIG. 7B

SHADOW MASK APPARATUS AND METHODS FOR VARIABLE ETCH DEPTHS

FIELD OF THE DISCLOSURE

The present disclosure generally relates to processing of grating materials. More specifically, the disclosure relates to apparatuses and methods of producing variable-depth grating materials.

BACKGROUND OF THE DISCLOSURE

Optical elements such as optical lenses have long been used to manipulate light for various advantages. Recently, micro-diffraction gratings have been utilized in holographic and augmented/virtual reality (AR and VR) devices. One particular AR and VR device is a wearable display system, such as a headset, arranged to display an image within a short distance from a human eye. Such wearable headsets are sometimes referred to as head mounted displays, and are provided with a frame displaying an image within a few centimeters of the user's eyes. The image can be a computer-generated image on a display, such as a micro display. The optical components are arranged to transport light of the desired image, where the light is generated on the display to the user's eye to make the image visible to the user. The display where the image is generated can form part of a light engine, so the image generates collimated light beams guided by the optical component to provide an image visible to the user.

The optical components may include structures with different slant angles, such as fins of one or more gratings, on a substrate, formed using an angled etch system. One example of an angled etch system is an ion beam chamber that houses an ion beam source. The ion beam source is configured to generate an ion beam, such as a ribbon beam, a spot beam, or full substrate-size beam. The ion beam chamber is configured to direct the ion beam at an angle relative to a surface normal of a substrate to generate a structure having a specific slant angle. Changing the slant angle of the structure to be generated by the ion beam requires substantial hardware reconfiguration of the of the ion beam chamber.

Forming optical devices that include different structures having different depths across the surface of substrate has conventionally been performed using gray-tone lithography. However, gray-tone lithography is a time-consuming and complex process, which adds considerable costs to any devices fabricated using the process.

Accordingly, improved methods and related equipment are needed for forming optical devices that include different structures with different slant angles and/or different depths across a single substrate.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

According to one embodiment, a method may include providing an etching material atop a substrate, and positioning a shadow mask between the etching material and an ion source, wherein the shadow mask is separated from the etching material by a distance. The method may further include etching the etching material using an ion beam passing through a set of openings of the shadow mask, wherein a first depth of a first portion of the etching material is different than a second depth of a second portion of the etching material.

According to another embodiment, a shadow mask apparatus may include a shadow mask positioned over a grating material, wherein the shadow mask is separated from the grating material by a distance. The shadow mask apparatus may further include a plurality of openings provided through the shadow mask, each of the plurality of openings defined by a leading edge and a trailing edge relative to a direction of travel of an ion beam, wherein the leading edge and the trailing edge of at least one opening of the plurality of openings vary from one another in height, the height relative to a top surface of the grating material.

According to yet another embodiment, a method of forming an optical grating may include providing an optical grating material atop a substrate, and positioning a shadow mask between the grating material and an ion source, wherein the shadow mask is separated from the optical grating material by a distance. The method may further include forming a plurality of structures by etching the optical grating material using an ion beam passing through a set of openings of the shadow mask, wherein a first depth of a first portion of the optical grating material is different than a second depth of a second portion of the optical grating material.

BRIEF DESCRIPTION OF THE DRAWINGS

The accompanying drawings illustrate exemplary approaches of the disclosure, including the practical application of the principles thereof, as follows:

FIG. 2B is a top, schematic cross-sectional view of the angled etch system shown in FIG. 2A, according to embodiments of the present disclosure;

FIG. 5A depicts a side, cross-sectional view along cut line 5A-5A of FIG. 4, according to embodiments of the present disclosure;

FIG. 5B depicts a side cross-sectional view along cut line 5B-5B of FIG. 4, according to embodiments of the present disclosure;

FIG. 6A depicts a side, cross-sectional view of a mask and grating material, according to embodiments of the present disclosure;

FIG. 6B depicts a frontal view of the mask and grating material of FIG. 6A, according to embodiments of the present disclosure;

FIG. 7A depicts a side, cross-sectional view of a mask and grating material, according to embodiments of the present disclosure;

FIG. 7B depicts a frontal view of the mask and grating material of FIG. 7A, according to embodiments of the present disclosure;

Figure 1:
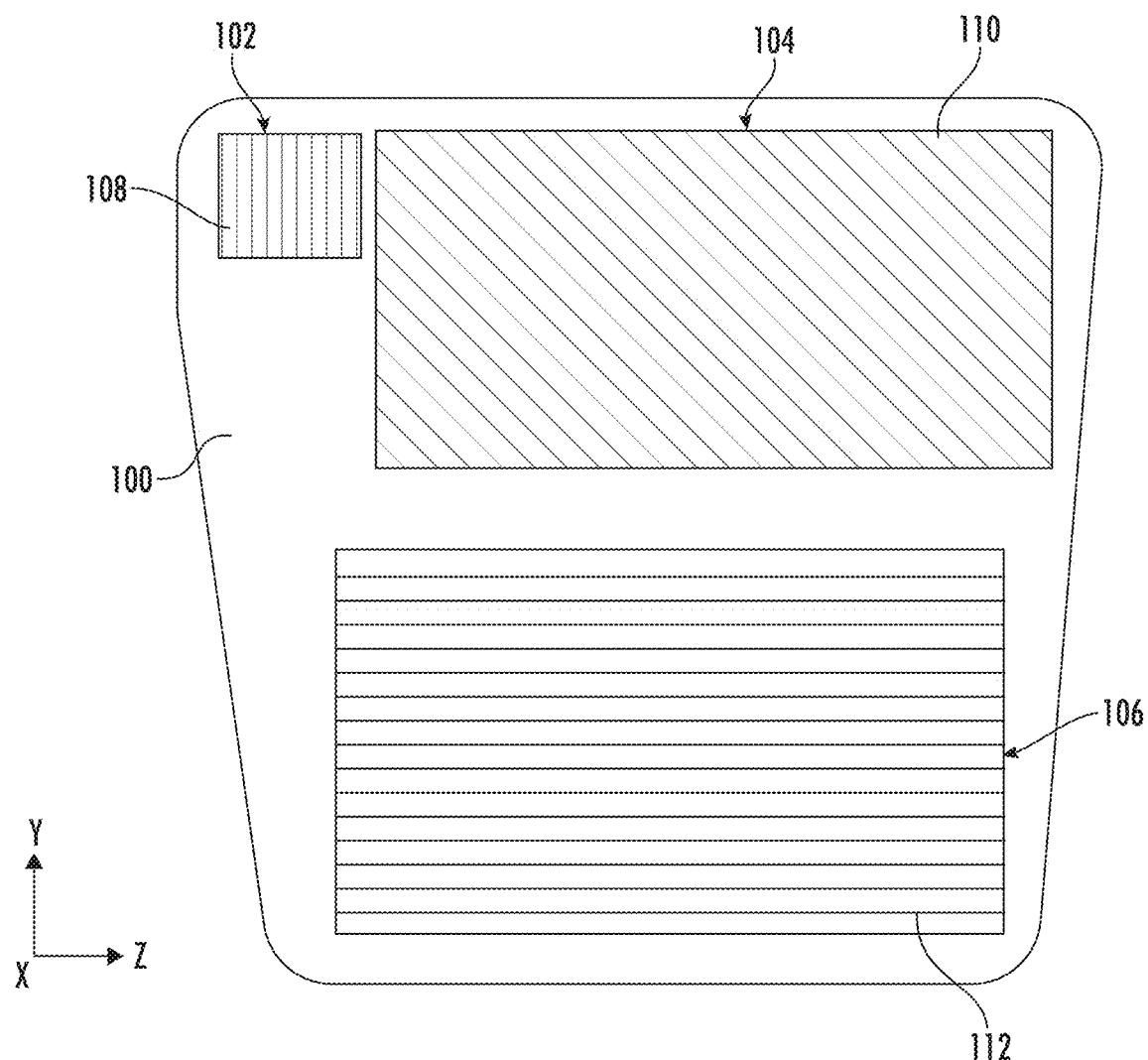
FIG. 1 is a perspective, frontal view of an optical device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Apparatuses, systems, and methods in accordance with the present disclosure will now be described more fully hereinafter with reference to the accompanying drawings, where various embodiments are shown. The apparatuses, systems, methods may be embodied in many different forms and are not to be construed as being limited to the embodiments set forth herein. Instead, these embodiments are provided so the disclosure will be thorough and complete, and will fully convey the scope of the apparatuses, systems, and methods to those skilled in the art.

FIG. 1 is a perspective, frontal view of a device 100, such as an optical device, according to embodiments of the present disclosure. Examples of the optical device 100 include, but are not limited to, a flat optical device and a waveguide (e.g., a waveguide combiner). The optical device 100 includes one or more structures, such as gratings. In one embodiment, which can be combined with other embodiments described herein, the optical device 100 includes an input grating 102, an intermediate grating 104, and an output grating 106. Each of the gratings 102, 104, 106 includes corresponding structures 108, 110, 112 (e.g., fins). In one embodiment, which can be combined with other embodiments described herein, the structures 108, 110, 112 and depths between the structures include sub-micron critical dimensions (e.g., nano-sized critical dimensions), which may vary in one or more dimensions across the optical device 100.

Figure 2A:
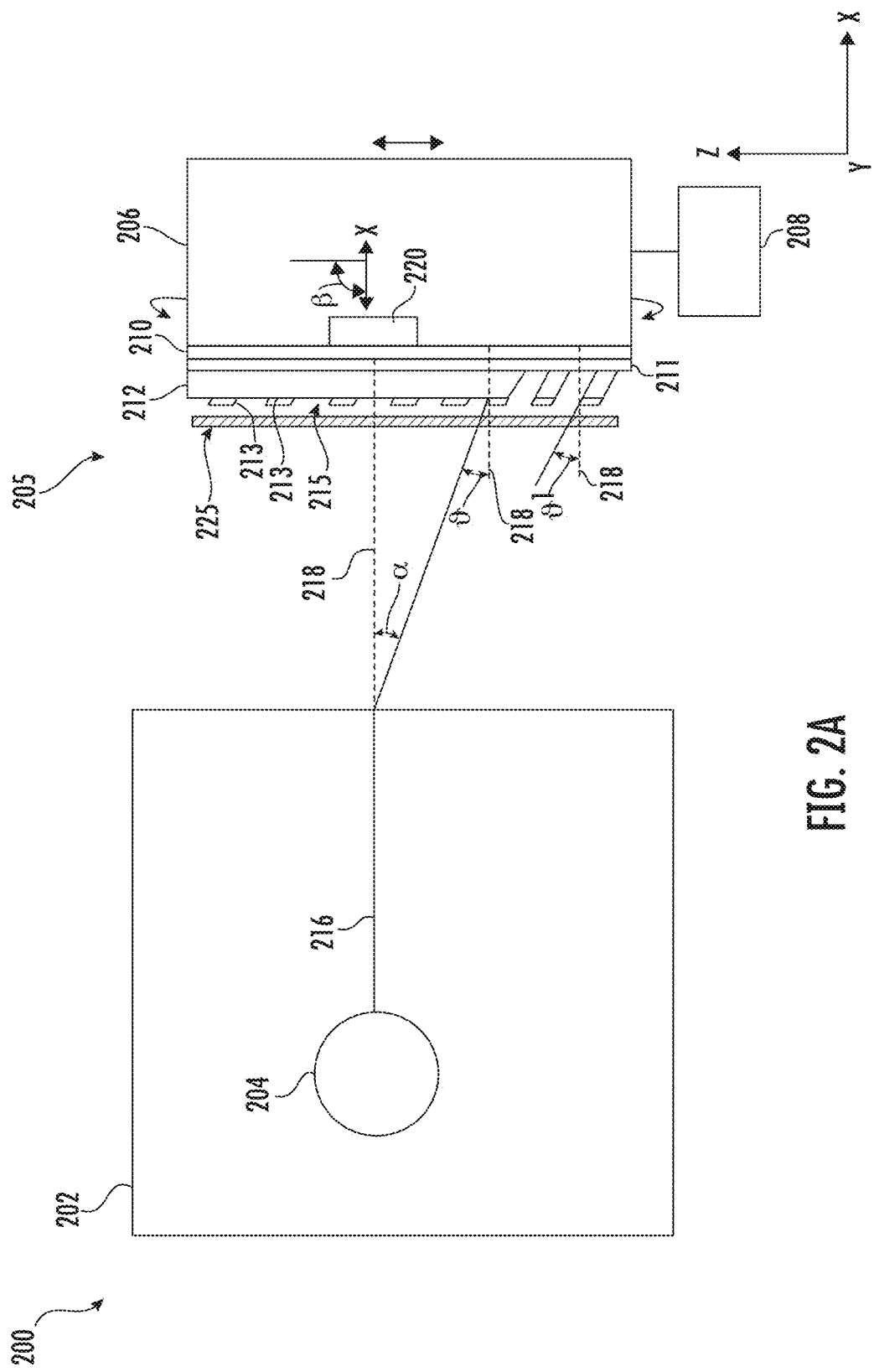
FIG. 2A is a side, schematic cross-sectional view of an angled etch system, according to embodiments of the present disclosure.

FIG. 2A is a side, schematic cross-sectional view and FIG. 2B is a top, schematic cross-sectional view of an angled etch system (hereinafter "system") 200, such as the Varian VIISta® system available from Applied Materials, Inc. located in Santa Clara, Calif. It is to be understood that the system 200 described below is an exemplary angled etch system and other angled etch systems, including angled etch systems from other manufacturers, may be used to or modified to form the structures described herein on a substrate.

FIGS. 2A-2B show a device 205 disposed on a platen 206. The device 205 may include a substrate 210, an etch stop layer 211 disposed over the substrate 210, a etching layer to be etched, such as a grating material 212 disposed over the etch stop layer 211, and a hardmask 213 disposed over the grating material 212. It will be appreciated that the device 205 may include different layering materials and/or combinations in other embodiments. For example, the etching layer may be a blanket film to be processed, such as a photoresist-type material or an optically transparent material (e.g., silicon or silicon nitride). The blanket film may be processed using a selective area processing (SAP) etch cycle(s) to form one or more sloped or curved surfaces of the device 205.

To form structures (e.g., fins) having slant angles, the grating material 212 may be etched by the system 200. In one embodiment, the grating material 212 is disposed on the etch stop layer 211 disposed on the substrate 210. In one embodiment, the one or more materials of the grating material 212 are selected based on the slant angle of each structure to be formed and the refractive index of the substrate 210. In some embodiments, the grating material 212 includes one or more of silicon oxycarbide (SiOC), titanium dioxide ($TiO_2$), silicon dioxide ($SiO_2$), vanadium (IV) oxide (VOx), aluminum oxide ($Al_2O_3$), indium tin oxide (ITO), zinc oxide (ZnO), tantalum pentoxide ($Ta_2O_5$), silicon nitride ($Si_3N_4$), titanium nitride (TiN), and/or zirconium dioxide ($ZrO_2$) containing materials. The grating material 212 can have a refractive index between about 1.5 and about 2.65.

In some embodiments, the patterned hardmask 213 is a non-transparent hardmask that is removed after the device 205 is formed. For example, the non-transparent hardmask 213 can include reflective materials, such as chromium (Cr) or silver (Ag). In another embodiment, the patterned hardmask 213 is a transparent hardmask. In one embodiment, the etch stop layer 211 is a non-transparent etch stop layer that is removed after the device 205 is formed. In another embodiment, the etch stop layer 211 is a transparent etch stop layer.

The system 200 may include an ion beam chamber 202 that houses an ion beam source 204. The ion beam source 204 is configured to generate an ion beam 216, such as a ribbon beam, a spot beam, or full substrate-size beam. The ion beam chamber 202 is configured to direct the ion beam 216 at a first ion beam angle α relative to a surface normal 218 of substrate 210. Changing the first ion beam angle α may require reconfiguration of the hardware of the ion beam chamber 202. The substrate 210 is retained on a platen 206 coupled to a first actuator 208. The first actuator 208 is configured to move the platen 206 in a scanning motion along a y-direction and/or a z-direction. In one embodiment, the first actuator 208 is further configured to tilt the platen 206, such that the substrate 210 is positioned at a tilt angle β relative to the x-axis of the ion beam chamber 202. In some embodiments, the first actuator 208 can further be configured to tilt the platen 206 relative to the y-axis and/or z-axis.

The first ion beam angle α and the tilt angle β result in a second ion beam angle ϑ relative to the surface normal 218 of the substrate 210 after the substrate 210 is tilted. To form structures having a slant angle ϑ' relative to the surface normal 218, the ion beam source 204 generates an ion beam 216 and the ion beam chamber 202 directs the ion beam 216 towards the substrate 210 at the first ion beam angle α. The first actuator 208 positions the platen 206, so that the ion beam 216 contacts the grating material 212 at the second ion beam angle ϑ and etches the grating material 212 to form the structures having a slant angle ϑ' on desired portions of the grating material 212.

Conventionally, to form a portion of structures with a slant angle ϑ' than different than the slant angle ϑ' of an adjacent portion of structures, or to form structures having a different slant angle ϑ' on successive substrates, the first ion beam angle α is changed, the tilt angle β is changed, and/or multiple angled etch systems are used. Reconfiguring the hardware of the ion beam chamber 202 to change the first ion beam angle α is complex and time-consuming. Adjusting tilt angle β to modify the ion beam angle ϑ results in non-uniform depths of structures across portions of the substrate 210 as the ion beam 216 contacts the grating material 212 with different energy levels. For example, a portion positioned closer to the ion beam chamber 202 will have structures with a greater depth than structures of an adjacent portion positioned further away from the ion beam chamber 202. Using multiple angled etch systems increases the fabrication time and increases costs due the need of multiple chambers. To avoid reconfiguring the ion beam chamber 202, adjusting the tilt angle β to modify the ion beam angle ϑ, and using multiple angled etch systems, the angled etch system 200 may include a second actuator 220 coupled to the platen 206 to rotate the substrate 210 about the x-axis of the platen 206 to control the slant angle ϑ' of structures.

During use, the ion beam 216 may be extracted when a voltage difference is applied using a bias supply between the ion beam chamber 202 and substrate 210, or substrate platen, as in known systems. The bias supply may be coupled to the ion beam chamber 202, for example, where the ion beam chamber 202 and substrate 210 are held at the same potential.

The trajectories of ions within the ion beam 216 may be mutually parallel to one another or may lie within a narrow angular spread range, such as within 10 degrees of one another or less. In other embodiments, the trajectory of ions within the ion beam 216 may converge or diverge from one another, for example, in a fan shape. In various embodiments, the ion beam 216 may be provided as a ribbon reactive ion beam extracted as a continuous beam or as a pulsed ion beam, as in known systems.

In various embodiments, gas, such as reactive gas, may be supplied by a source to the ion beam chamber 202. The plasma may generate various etching species or depositing species, depending upon the exact composition of species provided to the ion beam chamber 202. The ion beam 216 may be composed of any convenient gas mixture, including inert gas, reactive gas, and may be provided in conjunction with other gaseous species in some embodiments. In some embodiments, the ion beam 216 and other reactive species may be provided as an etch recipe to the substrate 210 so as to perform a directed reactive ion etching (RIE) of a layer, such as the grating material 212. Such an etch recipe may use known reactive ion chemistries for etching materials such as oxide or other material, as known in the art. In other embodiments, the ion beam 216 may be formed of inert species where the ion beam 216 is provided to etch the substrate 210 or more particularly, the grating material 212, by physical sputtering, as the substrate 210 is scanned with respect to ion beam 216.

As further shown, the system 200 may include one or more proximity or shadow masks 225 positioned between the ion beam chamber 202 and the device 205. The shadow mask (hereinafter "mask") 225 may include a plurality of openings formed therethrough, which permit passage of the ion beam 216 towards the substrate 210. The mask 225 may be separated from a top surface 213 of the grating material 212 by a gap or distance 215. Stated another way, the mask 225 is not typically formed directly atop the device 205. However, in an alternative embodiment, the mask 225 may be in direct physical contact with the device 205, while one or more edges defining at least one of the plurality of openings through the mask 225 is spaced apart or raised above the device 205 to create a shadow effect, as will be described in greater detail herein.

Figure 3A:
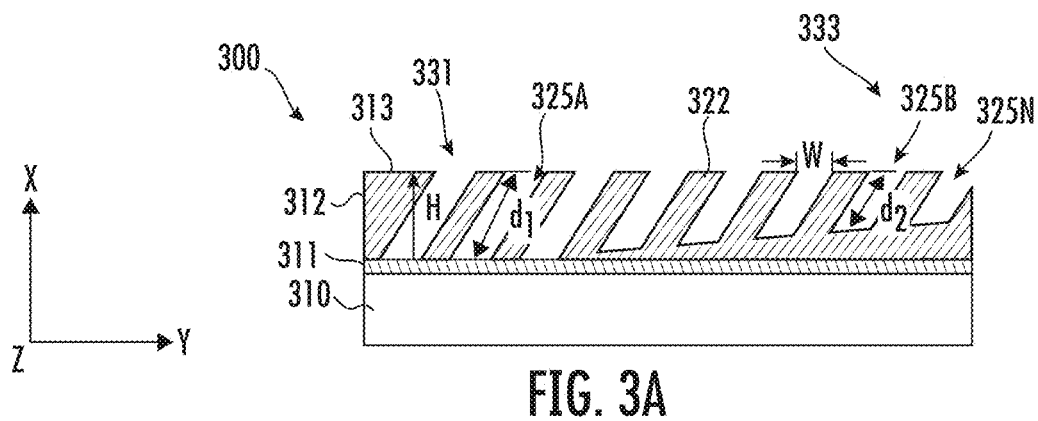
FIG. 3A depicts a side, cross sectional view of an optical grating component formed from a grating material, according to embodiments of the disclosure.
Figure 3B:
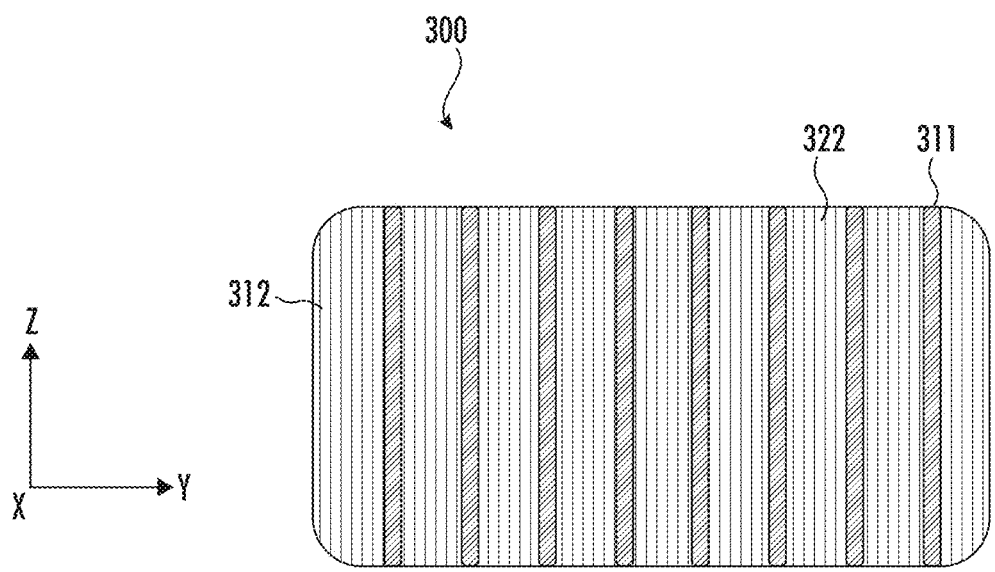
FIG. 3B depicts a frontal view of the optical grating component of FIG. 3A, according to embodiments of the present disclosure.

FIG. 3A depicts a side cross sectional view of an optical grating component 300 formed from the grating material 312 according to embodiments of the disclosure. FIG. 3B depicts a frontal view of the optical grating component 300. As shown, the optical grating component 300 includes a substrate 310, and the optical grating material 312 disposed on the substrate 310. The optical grating component 300 may be the same or similar to the input grating 102, the intermediate grating 104, and/or the output grating 106 of FIG. 1. In some embodiments, the substrate 310 is an optically transparent material, such as a known glass. In some embodiments, the substrate 310 is silicon. In the latter case, the substrate 310 is silicon, and another process is used to transfer grating patterns to a film on the surface of another optical substrate, such as glass or quartz. The embodiments are not limited in this context. In the non-limiting embodiment of FIG. 3A and FIG. 3B, the optical grating component 300 further includes an etch stop layer 311, disposed between the substrate 310 and the grating material 312.

In some embodiments, the optical grating optical grating component 300 may include a plurality of angled structures, shown as angled components or structures 322 separated by trenches 325A-325N. The structures 322 may be disposed at a non-zero angle of inclination (φ) with respect to a perpendicular to a plane (e.g., y-z plane) of the substrate 310 and the top surface 313 of the grating material 312. The angled structures 322 may be included within one or more fields of slanted gratings, the slanted grating together forming "micro-lenses."

In the example of FIG. 3A, the angled structures 322 and the trenches 325A-325N define a variable height along the direction parallel to the y-axis. For example, a depth 'd1' of a first trench 325A in a first portion 331 of the optical grating component 300 may be different than a depth 'd2' of a second trench 325B in a second portion 333 of the optical grating component 300. In some embodiments, a width of the angled structures 322 and/or the trenches 325 may also vary, e.g., along the y-direction.

The angled structures 322 may be accomplished by scanning the substrate 310 with respect to the ion beam using a processing recipe. In brief, the processing recipe may entail varying at least one process parameter of a set of process parameters, having the effect of changing, e.g., the etch rate or deposition rate caused by the ion beam during scanning of the substrate 310. Such process parameters may include the scan rate of the substrate 310, the ion energy of the ion beam, duty cycle of the ion beam when provided as a pulsed ion beam, the spread angle of the ion beam, and rotational position of the substrate 310. The etch profile may be further altered by varying the ion beam quality across the mask. Quality may include intensity/etch rate such as varying current with duty cycle or beam shape for different angles. In at least some embodiments herein, the processing recipe may further include the material(s) of the grating material 312, and the chemistry of the etching ions of the ion beam. In yet other embodiments, the processing recipe may include starting geometry of the grating material 312, including dimensions and aspect ratios. The embodiments are not limited in this context.

Figure 4:
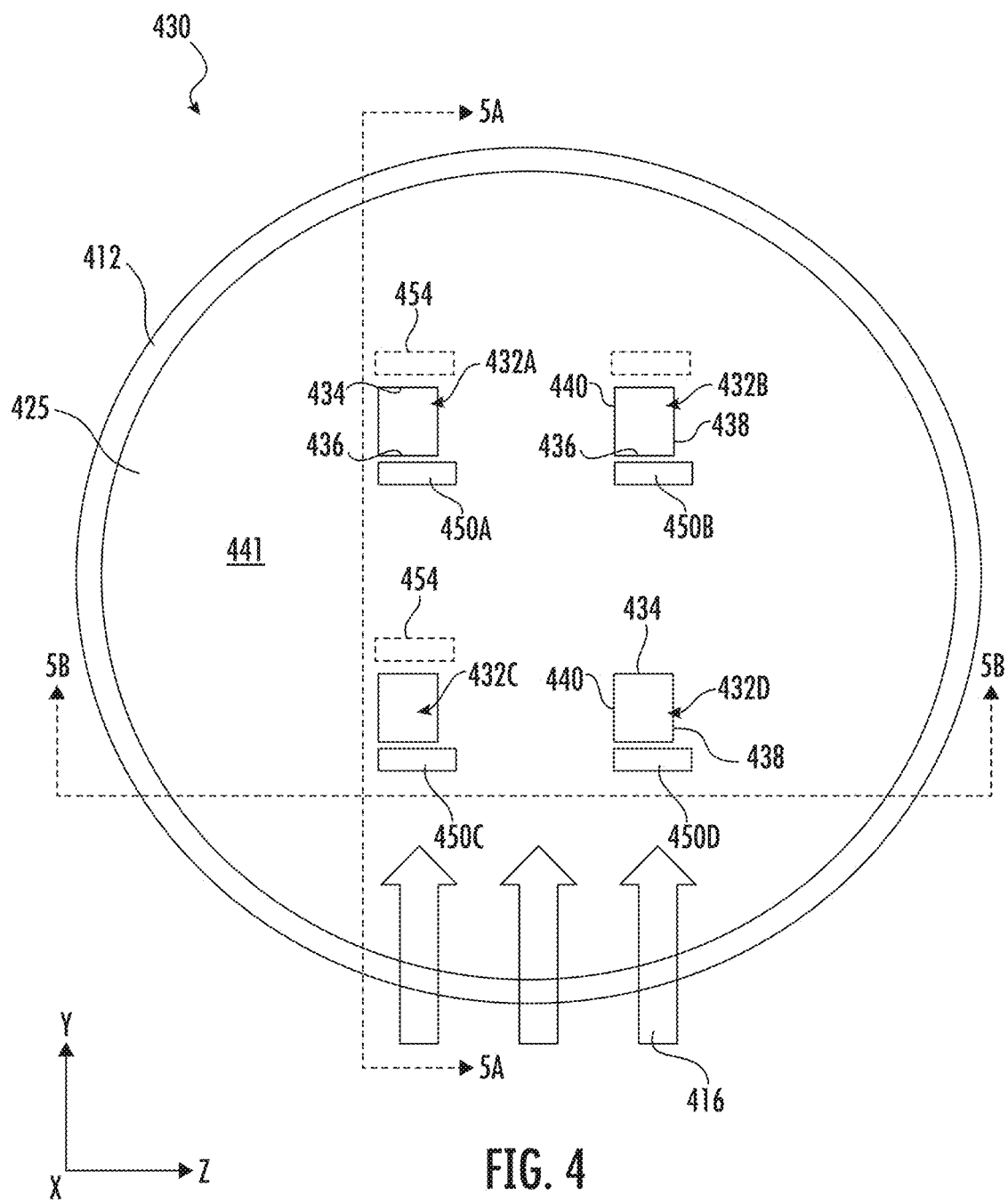
FIG. 4 depicts a frontal view a shadow mask apparatus, according to embodiments of the present disclosure.

Turning now to FIG. 4, there is shown a front view of a shadow mask apparatus (hereinafter "apparatus") 430 according to embodiments of the present disclosure. As shown, the apparatus may include a shadow mask (hereinafter "mask") 425 positioned over a grating material 412 disposed on a substrate. The mask 425 may include a plurality of openings 432A-432D provided therethrough. Each of the plurality of openings 432A-432D may be defined by a leading edge 434 (e.g., relative to a direction of travel of and an ion beam 416) opposite a trailing edge 436. Each of the plurality of openings 432A-432D may be further defined by a first side edge 438 opposite a second side edge 440. Although shown as four (4) rectangles, it'll be appreciated that the plurality of openings 432A-432D may take on virtually any number, shape, or configuration. Furthermore, it'll be appreciated that one or more openings of the plurality of openings 432A-432D may take on a unique or different shape/configuration than the rest of the openings. Embodiments herein are not limited in this context.

As shown in FIGS. 4, 5A, and 5B, the apparatus 430 may further include a plurality of raised surface features 450A-D along the trailing edge 436 and/or the leading edge 434 of one or more of the plurality of openings 432A-432D. The raised surface features 450A-450D may extend above a plane (e.g., y-z) defined by a top surface 441 of the mask 425. In some embodiments, the apparatus 430 may further include a second set of surface features 454 extending below a plane (e.g., y-z) defined by a bottom surface 443 of the mask 425. The raised surface features 450A-D and the second set of surface features 454 may partially block the ion beam 416, thus influencing an amount, angle, and/or depth of the ion beam 416 passing through respective openings 432A-432D and impacting the grating material 412. In one example, increasing a height 'H' of a particular surface feature may decrease an amount of etching to the grating material 412 proximate the trailing edge 436. As shown, steeper angles in the ion beam 416 may be blocked by the mask 425 and raised surface features 450A-D, while the relatively shallower angles of the ion beam 416 etch the grating material 412 through the opening 432. Additional etching examples/variations will be described below.

As shown in FIGS. 5A-5B, the apparatus 430 may include a plurality of optical gratings 453 across the grating material 412. The plurality of optical gratings 453 may represent input gratings, intermediate gratings, output gratings, or a combination thereof. In some embodiments, the ion beam 416 passing through a single opening of the set of openings 432A-D may simultaneously impact at least two of the optical gratings 453.

In some embodiments, one or more of the raised surface features 450A-450D may have a non-uniform height 'H' along a length, e.g., along the z-direction, which may generally be perpendicular to a direction of travel of the ion beam 416. For example, as best shown in FIG. 5B, raised surface feature 450C may have a sloped or triangular profile in the x-z plane. Meanwhile, raised surface feature 450D may have a curved profile in the x-z plane defined by a set of peaks 451 and a central depression 452. Although non-limiting, the raised surface feature 450D may result in a parabolic shaped grating material 412 having a depressed central area. The raised surface features 450A-D may take on virtually any variety of shapes or dimensions in various embodiments. Although not shown, one or more of the raised surface features 450A-450D may additionally, or alternatively, have a varied thickness, e.g., along the y-direction and/or the z-direction.

Furthermore, although shown in this embodiment along the trailing edges 436 of the openings 432A-432D, it will be appreciated that raised or protruding surface features may additionally, or alternatively, be formed along or proximate the first side edge 438, the second side edge 440, and/or the leading edge 434. For example, as best shown in FIGS. 5A-5B, the second set of surface features 454, which generally extend in an opposite direction (e.g., negative x-direction) from the raised surface features 450A-450D, may be located adjacent the leading edge 434 of one or more of the openings 432A-432D.

Turning now to FIG. 6A, a simplified, cross-sectional view of an example mask 625 and grating material 612 according to embodiments of the present disclosure will be described. As shown, the mask 625 includes an opening 632 defined by a leading edge 634 and a trailing edge 636. The opening 632 may have a dimension or distance 'ID' between the leading edge 634 and the trailing edge 636. The mask 625 may be positioned over a grating material 612 and a substrate (not shown). The grating material 612 may be defined by first and second grating edges 655, 656 positioned on opposite sides of an approximate midpoint 'MP'. As shown, a center of the opening 632 may be positioned substantially above the midpoint.

The mask 625 may be separated from the grating material 612 by a constant or varied distance. For example, the leading edge 634 may be separated from the grating material 612 by a leading edge height 'LH' and the trailing edge 636 may be separated from the grating material 612 by a trailing edge height 'TH'. In this embodiment, LH=TH.

During use, the ion beam 616 is delivered towards the grating material 612 at a non-zero angle of inclination ($\phi$) with respect to a perpendicular 623 to a plane extending parallel to a the top surface 660 of the mask 625. The ion beam 616 impacts (e.g., etches) the grating material 612 in a processing area 658, which may be defined by a downstream boundary or edge 664 and an upstream boundary or edge 665. In some embodiments, the non-zero angle of inclination is constant as the ion beam 616 passes over the mask 625. In some embodiments, a power (e.g., voltage and/or current) applied to generate the ion beam 616 can be constant or varied. Although not shown, the processing area 658 may include a plurality of angled structures and corresponding trenches as a result of an etch process by the ion beam 616.

As demonstrated in FIG. 6B, due to the angle of the ion beam 616, the grating material 612 of the processing area 658 will be recessed faster/deeper in a first area 661 near the leading edge 634 than in a second area 662 near the trailing edge 636. As a result, the first area 661 of the processing area 658 may have a deeper depth (e.g., in the x-direction) than in the second area 662. As shown, the downstream edge 664 of the processing area 658 may extend beneath and beyond (e.g., along the y-direction) the leading edge 634 of the mask 625 due to the angle of the ion beam 616 and positioning/size of the opening 632 relative to the grating material 612. In the case the grating material 612 includes a plurality of fins and trenches, the trenches in the first area 661 may be deeper than the trenches in the second area. Beam power may further be varied (e.g., increased) as the ion beam 616 moves from the trailing edge 636 towards the leading edge 634 to increase the depth in the first area 661.

As shown in FIGS. 7A-7B, to further increase etching of the grating material 612, a distance 'D1' of the opening 632 between the leading edge 634 and the trailing edge 636 of the mask 625 may be increased by shifting, e.g., along the negative y-direction, the trailing edge 636 of the mask 625 to be closer to the first grating edge 655. More specifically, the trailing edge 636 of the mask 625 may be relatively closer to the first grating edge 655 of the grating material 612 than the leading edge 634 of the mask 625 is to the second grating edge 656 of the grating material 612. As a result, the ion beam 616 may have a greater impact (e.g., increased/deeper etching) on the grating material 612, particularly in the first area 661 of the processing area 658. An overall size of the processing area 658 may also be increased by increasing the size of the opening 632, as evidenced by a grating distance 'GD' between the first and second grating edges 655, 656. In this embodiment, LH=TH. As further shown, the downstream edge 664 of the processing area 658 may extend beneath and beyond (e.g., along the y-direction) the leading edge 634 of the mask 625 due to the angle of the ion beam 616 and positioning/size of the opening 632 relative to the grating material 612.

Figure 8A:
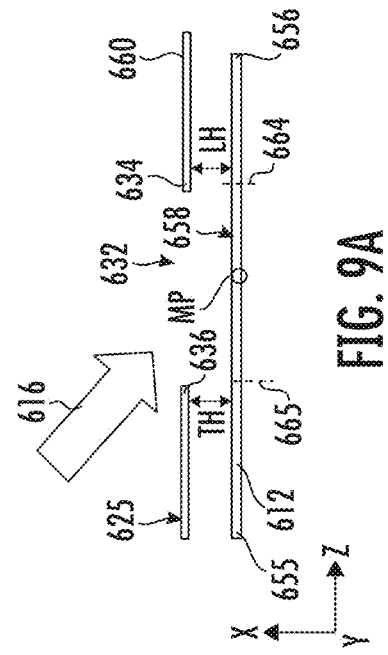
FIG. 8A depicts a side, cross-sectional view of a mask and grating material, according to embodiments of the present disclosure.
Figure 8B:
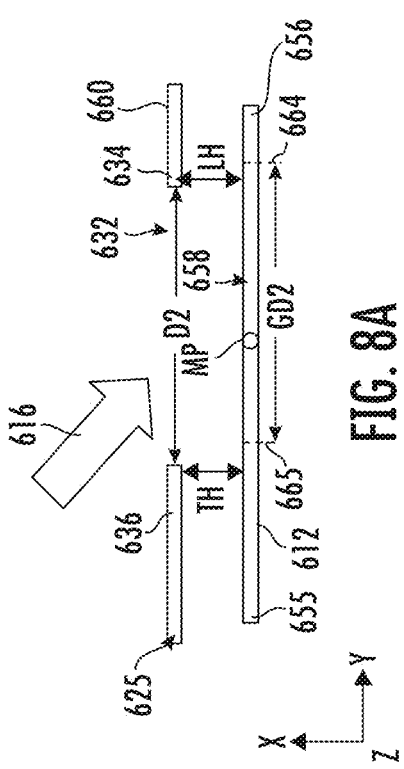
FIG. 8B depicts a frontal view of the mask and grating material of FIG. 8A, according to embodiments of the present disclosure.

In another example, as shown in FIGS. 8A-8B, a distance 'D2' of the opening 632 between the leading edge 634 and the trailing edge 636 of the mask 625 may be increased by shifting, e.g., along the y-direction, the leading edge 634 of the mask 625 to be closer to the second grating edge 656. In this embodiment, the leading edge 634 of the mask 625 may be relatively closer to the second grating edge 656 of the grating material 612 than the trailing edge 636 of the mask 625 is to the first grating edge 655 of the grating material 612. Furthermore, the midpoint 'MP' of the grating material 612 may be relatively closer to the trailing edge 636 than the leading edge 634. As a result, the ion beam 616 may have a greater impact (e.g., increased/deeper etching) on the grating material 612, particularly in the first area 661 of the processing area 658. An overall size of the processing area 658 may also be increased, as evidenced by grating distance 'GD2' between the first and second grating edges 655, 656. In this embodiment, LH=TH. As further shown, the downstream edge 664 of the processing area 658 again may extend beneath and beyond (e.g., along the y-direction) the leading edge 634 of the mask 625 due to the angle of the ion beam 616 and positioning/size of the opening 632 relative to the grating material 612.

Figure 9A:
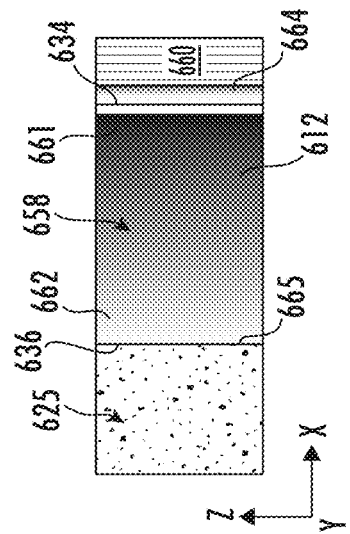
FIG. 9A depicts a side, cross-sectional view of a mask and grating material, according to embodiments of the present disclosure.
Figure 9B:
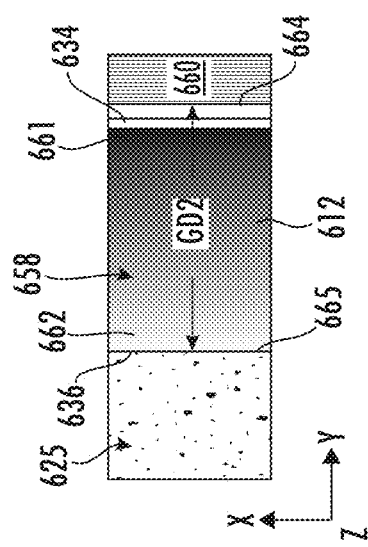
FIG. 9B depicts a frontal view of the mask and grating material of FIG. 9A, according to embodiments of the present disclosure.

As shown in FIGS. 9A-9B, etching of the processing area 658 may be modified by varying (e.g., decreasing) the leading edge height 'LH' at the leading edge 634 relative to the trailing edge height 'TH' at the trailing edge 636. In this embodiment, LH<TH. As a result, less of the ion beam 616 may be permitted to travel through the opening 632 to impact the processing area 658, particularly downstream of the downstream edge 664. A variable etch depth may still be achieved, however, with the first area 661 of the processing area 658 being etched more/faster than the second area 662.

Figure 10A:
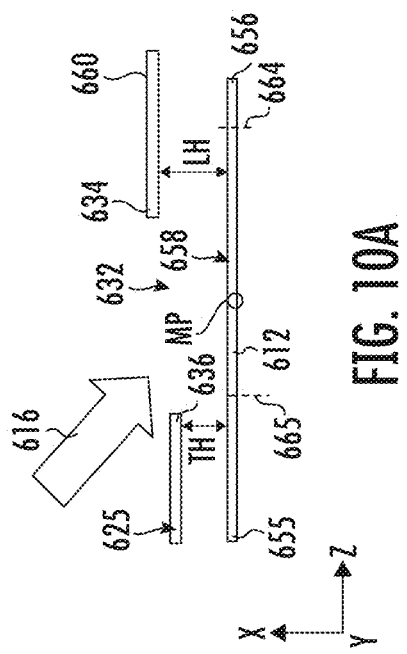
FIG. 10A depicts a side, cross-sectional view of a mask and grating material, according to embodiments of the present disclosure.
Figure 10B:
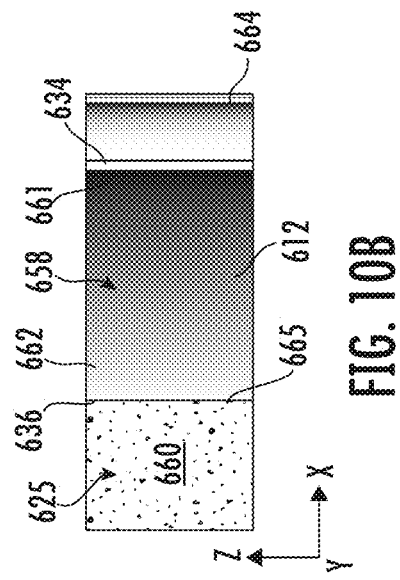
FIG. 10B depicts a frontal view of the mask and grating material of FIG. 10A, according to embodiments of the present disclosure.

As shown in FIGS. 10A-10B, etching of the processing area 658 may alternatively be modified by varying (e.g., increasing) the leading edge height 'LH' at the leading edge 634 relative to the trailing edge height 'TH' at the trailing edge 636. In this embodiment, LH>TH. As a result, more of the ion beam 616 may be permitted to travel through the opening 632 to impact the processing area 658, including downstream of the downstream edge 664. A variable etch depth may be increased in this embodiment, with the first area 661 of the processing area 658 being etched significantly greater/faster than the second area 662.

Figure 11A:
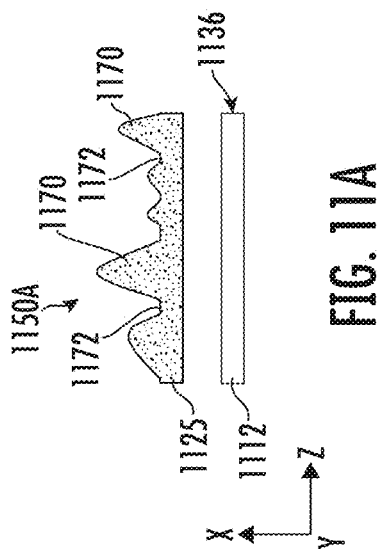
FIG. 11A depicts a side, cross-sectional view of a raised surface feature, according to embodiments of the present disclosure.
Figure 11B:
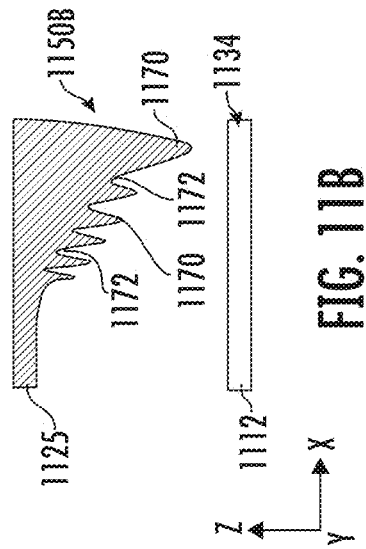
FIG. 11B depicts a frontal view of the raised surface feature of FIG. 11A, according to embodiments of the present disclosure.

Turning now to FIGS. 11A-11B, a set of surface features 1150A-1150B according to embodiments of the disclosure is shown. In this embodiment, the surface feature 1150A may be positioned proximate the trailing edge 1136 of the mask 1125, while the surface feature 1150B may be positioned proximate the leading edge 1134 of the mask 1125. In this non-limiting embodiment, the surface features 1150A generally extend in the positive x-direction, while the surface features 1150B generally extend in the negative x-direction. As shown, both surface features 1150A-1150B may include a series of peaks 1170 and valleys 1172. During processing of the grating material 1112, the peaks 1170 generally will block the ion beam, while the valleys 1172 will permit the ion beam to pass through. Although non-limiting, the shape, configuration, and number of peaks 1170 and valleys 1172 may differ between the raised surface features 1150A-1150B. Embodiments herein are not limited in this context.

Figure 12:
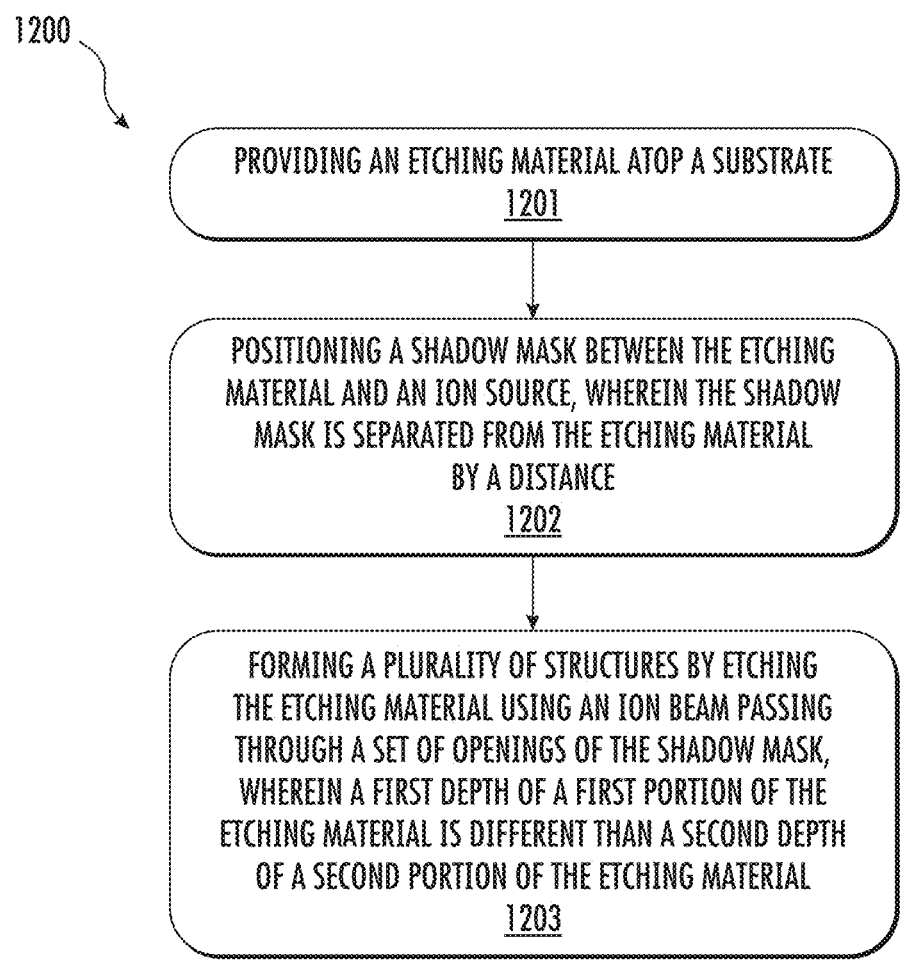
FIG. 12 is a flowchart of a method, according to embodiments of the present disclosure.

Turning to FIG. 12, a method 1200 according to embodiments of the present disclosure will be described. As shown, at block 1201, the method 1200 may include providing an etching material atop a substrate. In some embodiments, the etching material may be a grating material, e.g., an optical grating material including one or more of silicon oxycarbide (SiOC), titanium dioxide (TiO$_2$), silicon dioxide (SiO$_2$), vanadium (IV) oxide (VOx), aluminum oxide (Al$_2$O$_3$), indium tin oxide (ITO), zinc oxide (ZnO), tantalum pentoxide (Ta$_2$O$_5$), silicon nitride (Si$_3$N$_4$), titanium nitride (TiN), and/or zirconium dioxide (ZrO$_2$) containing materials.

At block 1202, the method 1200 may include positioning a shadow mask between the etching material and an ion source, wherein at least a portion of the shadow mask is separated from the etching material by a distance. In some embodiments, multiple shadow masks may be positioned between the etching material and the ion source. In some embodiments, the shadow mask may be provided directly atop a portion of the etching material, wherein one or more sections, e.g., sections near shadow mask openings, may be spaced apart from the etching material by a gap.

At block 1203, the method 1200 may include forming a plurality of structures by etching the etching material using an ion beam passing through a set of openings of the shadow mask, wherein a first depth of a first portion of the etching material is different than a second depth of a second portion of the etching material. In some embodiments, the method 1200 may include etching the etching material to form the plurality of structures and a plurality of trenches. In some embodiments, the method 1200 may include forming the plurality of structures at a non-zero angle with respect to a vertical extending from a top surface of the etching material.

In some embodiments, the method 1200 may include providing a raised surface feature along a leading edge or a trailing edge of one or more of the set of openings, wherein the raised surface feature has a non-uniform height along a direction extending parallel to the top surface of the grating material. The raised surface feature(s) may extend above a plane defined by the top surface of the grating material.

In some embodiments, the method 1200 may include varying an opening edge height, relative to the top surface of the grating material, between the leading edge and a trailing edge of one or more openings of the set of openings. In some embodiments, the method 1200 may additionally, or alternatively, include varying the opening edge height, relative to the top surface of the grating material, between a first side edge and a second side edge of one or more openings of the set of openings.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In various embodiments, design tools can be provided and configured to create the datasets used to pattern the layers of the grating material and the diffracted optical elements described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the description, the various features and functionality described herein may be implemented in any given application. Furthermore, the various features and functionality can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

By utilizing the embodiments described herein, a waveguide with regions of variable etch depth is formed. A first technical advantage of the waveguide of the present embodiments includes improved manufacturing efficiency by eliminating more time consuming and difficult processes. Further, a second technical advantage of the grating structures of the present embodiments includes providing a two dimensional or a three-dimensional shape, enabling use of the waveguide in an increased range of applications.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   providing an etching material atop a substrate;
   positioning a shadow mask between the etching material and an ion source, wherein at least a portion of the shadow mask is separated from the etching material by a distance;
   providing a raised surface feature along a leading edge or a trailing edge of one or more openings of a set of openings of the shadow mask, wherein an uppermost surface of the raised surface feature extends above an uppermost surface of the shadow mask, and wherein the uppermost surface of the raised surface feature extends at a non-zero angle relative to the uppermost surface of the shadow mask; and
   etching the etching material using an ion beam passing through the set of openings of the shadow mask, wherein a first depth of a first portion of the etching material is different than a second depth of a second portion of the etching material.

2. The method of claim 1, further comprising etching the etching material to form a plurality of structures and a plurality of trenches.

3. The method of claim 2, further comprising forming the plurality of structures at a non-zero angle with respect to a vertical extending from a top surface of the etching material.

4. The method of claim 1, further comprising varying a distance between the shadow mask and the top surface of the etching material, between the leading edge and the trailing edge of the one or more openings of the set of openings.

5. The method of claim 4, further comprising varying the distance between the shadow mask and the top surface of the etching material, between a first side edge and a second side edge of the one or more openings of the set of openings.

6. The method of claim 1, further comprising aligning an opening of the set of openings over a processing area of the etching material impacted by the ion beam, wherein a distance between the trailing edge of the opening and a first grating edge of the etching material is different than a second distance between the leading edge of the opening and a second grating edge of the etching material.

7. The method of claim 1, further comprising maintaining the ion beam at a constant power or a variable power while forming the plurality of structures.

8. The method of claim 1, further comprising forming a plurality of optical gratings across the etching material, wherein the ion beam passing through one opening of the set of openings simultaneously impacts at least two optical gratings of the plurality of optical gratings.

9. A method of forming an optical grating, comprising:
providing an optical grating material atop a substrate;
positioning a shadow mask between the optical grating material and an ion source, wherein at least a portion of the shadow mask is separated from the optical grating material by a distance;
providing a raised surface feature along a leading edge or a trailing edge of one or more openings of a set of openings of the shadow mask, wherein an uppermost surface of the raised surface feature extends above an uppermost surface of the shadow mask, and wherein the uppermost surface of the raised surface feature extends at a non-zero angle relative to the uppermost surface of the shadow mask; and
forming a plurality of structures by etching the optical grating material using an ion beam passing through the set of openings of the shadow mask, wherein a first depth of a first portion of the optical grating material is different than a second depth of a second portion of the optical grating material.

10. The method of claim 9, further comprising etching the optical grating material to form the plurality of structures and a plurality of trenches, wherein the plurality of structures are oriented at a non-zero angle with respect to a vertical extending from a top surface of the optical grating material.

11. The method of claim 10, further comprising varying, between the leading edge and the trailing edge of the one or more openings of the set of openings, a distance between the shadow mask and the top surface of the optical grating material.

12. The method of claim 10, wherein the raised surface feature extends above a plane defined by the top surface of the optical grating material.

* * * * *